United States Patent
Boehme

(10) Patent No.: US 9,496,689 B2
(45) Date of Patent: Nov. 15, 2016

(54) FRAME PROFILE FOR A RACK OF A SWITCHGEAR CABINET, AND FASTENING CLIP FOR THE FRAME PROFILE

(71) Applicant: Rittal GmbH & Co. KG, Herborn (DE)

(72) Inventor: Siegfried Boehme, Wolfen (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 14/596,866

(22) Filed: Jan. 14, 2015

(65) Prior Publication Data

US 2015/0200523 A1    Jul. 16, 2015

(30) Foreign Application Priority Data

Jan. 15, 2014    (DE) .................. 10 2014 100 417

(51) Int. Cl.
| | | |
|---|---|---|
| *H02B 1/30* | (2006.01) | |
| *H02B 1/01* | (2006.01) | |
| *H05K 7/18* | (2006.01) | |
| *F16B 2/20* | (2006.01) | |
| *H05K 7/02* | (2006.01) | |

(52) U.S. Cl.
CPC . *H02B 1/01* (2013.01); *F16B 2/20* (2013.01); *H02B 1/013* (2013.01); *H05K 7/02* (2013.01); *H05K 7/183* (2013.01); *H02B 1/30* (2013.01)

(58) Field of Classification Search
CPC .......... H04Q 1/02; H04Q 2201/02; H02B 1/01; H02B 1/013; H02B 1/30; H05K 7/02; H05K 7/183; F16B 2/20

USPC ....... 211/26, 182, 183, 189, 190; 312/265.1, 312/265.4

See application file for complete search history.

(56) References Cited

U.S. PATENT DOCUMENTS

| | | | | |
|---|---|---|---|---|
| 5,749,476 A | * | 5/1998 | Besserer | ............... H02B 1/301 211/182 |
| 5,775,051 A | | 7/1998 | Nicolai et al. | |
| 5,930,972 A | * | 8/1999 | Benner | .................... H02B 1/01 211/189 |
| 5,992,646 A | | 11/1999 | Benner | |

(Continued)

FOREIGN PATENT DOCUMENTS

| | | | | |
|---|---|---|---|---|
| DE | 4336204 A1 | * | 4/1995 | |
| DE | 4439551 C1 | * | 12/1995 | .............. H02B 1/28 |

(Continued)

*Primary Examiner* — Babajide Demuren
(74) *Attorney, Agent, or Firm* — Marshall & Melhorn, LLC

(57) ABSTRACT

A frame profile for a switchgear cabinet rack has two profile sides perpendicular to one another forming outer sides of the rack, and being in the form of a hollow-profile section. The profile sides transition into one another via transition sections that are perpendicular thereto and a connecting web without formation of an outer edge. The profile sides are adjoined, facing away from the transition sections, by first profile sections which are respectively perpendicular and parallel to the associated profile sides. At least the perpendicular or the parallel first profile sections have a row of fastening receptacles. The perpendicular first profile sections are adjoined by two profile sections which transition into an at least partially rounded contour section, the second profile sections each form with the contour section an undercut of the contour section on the outer side of the profile, and the frame profile encloses a coherent hollow chamber.

37 Claims, 21 Drawing Sheets

(56) References Cited

U.S. PATENT DOCUMENTS

| | | | | |
|---|---|---|---|---|
| 6,120,206 A * | 9/2000 | Benner | ............... | A47B 47/03 312/265.1 |
| 6,123,400 A * | 9/2000 | Nicolai | ............... | H02B 1/301 211/189 |
| 6,138,843 A * | 10/2000 | Nicolai | ............... | H02B 1/01 211/182 |
| 6,190,081 B1 * | 2/2001 | Besserer | ............... | H02B 1/32 211/183 |
| 6,206,211 B1 * | 3/2001 | Nicolai | ............... | H02B 1/01 211/182 |
| 6,217,138 B1 * | 4/2001 | Benner | ............... | H02B 1/01 211/182 |
| 6,231,142 B1 * | 5/2001 | Pochet | ............... | H02B 1/16 211/189 |
| 6,273,533 B1 * | 8/2001 | Nicolai | ............... | H02B 1/01 211/182 |
| 6,575,657 B1 * | 6/2003 | Reuter | ............... | H02B 1/32 211/183 |
| 6,915,616 B2 * | 7/2005 | Fontana | ............... | H05K 7/183 312/265.1 |
| 8,182,897 B2 * | 5/2012 | Shen | ............... | H02B 1/01 312/257.1 |
| 2002/0166831 A1 * | 11/2002 | Klassen | ............... | E05D 5/023 211/183 |
| 2013/0306584 A1 * | 11/2013 | Hofmann | ............... | H02B 1/01 211/182 |
| 2014/0374369 A1 * | 12/2014 | Proserpio | ............... | H02B 1/013 211/182 |

FOREIGN PATENT DOCUMENTS

| | | | | |
|---|---|---|---|---|
| DE | 4439614 | C1 * | 12/1995 | |
| DE | 19537016 | C1 * | 10/1996 | ............... H02B 1/01 |
| DE | 19536950 | C1 | 11/1996 | |
| DE | 19647814 | A1 * | 5/1998 | |
| DE | 202013006454 | U1 * | 10/2014 | ............... H02B 1/306 |
| EP | 0789983 | A1 | 8/1997 | |
| EP | 1601074 | A1 | 11/2005 | |

* cited by examiner

FRAME PROFILE FOR A RACK OF A SWITCHGEAR CABINET, AND FASTENING CLIP FOR THE FRAME PROFILE

BACKGROUND OF THE INVENTION

The invention relates to a frame profile for a rack of a switchgear cabinet, furthermore to a fastening clip for the frame profile, which can optionally be used together with an adapter.

A frame profile for a rack of a switchgear cabinet, said frame profile having two profile sides that are perpendicular to one another and form outer sides of the rack, and being in the form of a hollow-profile section, comprises the features whereby the profile sides transition into one another via transition sections that are perpendicular thereto and a connecting web without formation of an outer edge, the profile sides are adjoined, facing away from the transition sections, by first profile sections which are respectively perpendicular and parallel to the associated profile sides, and at least the parallel first profile sections are provided with a row of fastening receptacles.

Such frame profiles are known from EP 0 789 983 B1. The profile sides of the frame leg into which the receiving grooves are introduced provide a receiving capability for sealing elements, which can also be in the form of RF seals. By way of the transition sections and the connecting section, a receptacle in which hinge elements and closing elements can be accommodated is created in the region of the outer edges. A profile frame of this type is punched out of a sheet metal strip and edge-bent, or is produced as an extruded section or by profiling.

A further frame profile is known from DE 195 36 950 C1, in which the connecting strength of the frame profile is increased by additionally stiffening the connecting section by superimposing profile sections. The connecting section is stiffened symmetrically with respect to the cross section diagonal by two outwardly bent stiffening beads. These stiffening beads each comprise a section which extends preferably parallel to the facing outer side of the rack, and a section which is directed preferably parallel to the facing further profile side. The protrusion is in this case such that the function of the sealing webs and of the bearing webs which are formed on the profile sides is not impaired.

In both frame profiles, there are possibilities for interior fitting by the fastening receptacles provided on the respective profile sections, said fastening receptacles being in the form of rows of holes consisting of alternating slots and circular openings, which are often also referred to as system perforation. Depending on the design, a distinction is made between a 19" system perforation and a metric system perforation.

Switchgear cabinets which are based on racks are generally designed to be mountable side-by-side. In this case, importance is attached to good protection of the interior of the switchgear cabinet from dust and moisture. To this end, a seal is introduced between the frame profiles of the adjoining racks, before the adjacent racks are clamped together. An example for mounting side-by-side is given in EP 1 601 074 B1. The interior fitting possibilities are not influenced thereby.

SUMMARY OF THE INVENTION

It is the object of the present invention to design a frame profile of the generic type mentioned at the beginning such that improved, in particular more flexible possibilities for interior fitting arise.

This object is achieved by a frame profile according to claim 1, which can be used for constructing a rack according to claim 14. The particular design of the frame profile allows the use of a fastening clip for detachably attaching to a frame profile according to the invention, as is defined in claim 16. In particular embodiments, the fastening clip can be used with an adapter, with the result that further possibilities for interior fitting are allowed.

According to the invention, the frame profiles described at the beginning are configured such that the perpendicular first profile sections are adjoined by two profile sections which transition into an at least partially rounded contour section, wherein the second profile sections each form with the contour section an undercut of the contour section on the outer side of the profile, wherein the frame profile encloses a coherent hollow chamber. As will be explained in more detail, the contour section is used for the expanded attachment possibilities, wherein improved torsional stiffness is additionally achieved if the part chambers of the hollow chamber profile are no longer separated from one another but are formed in a coherent manner. To this end, provision is preferably made for the parallel first profile sections to be shorter than the associated profile sides in a cross-sectional view of the frame profile.

According to an advantageous configuration of the invention, the contour section has two mutually opposite rounded regions which are connected by a flattened region which extends parallel to the connecting web. Of course, a continuously rounded contour section is also possible, but by providing a flattened region, a row of holes can be formed thereon more easily in terms of manufacturing.

Further advantageously, the connecting web is at an angle of 135° to the two profile sides, such that the good attachment possibilities for hinges and the like to the outer side of the frame profile still arise.

The frame profile can furthermore be distinguished by the fact that the hollow chamber has two mutually opposite part chambers having a substantially rectangular cross section. This makes it easier to construct a rack, it then being possible to use corner connectors which can engage by way of simply designed pegs in these part chambers in order to orient the frame profiles relative to one another.

The transition region to the contour section is of particular significance because only thereby can the undercut that is essential to the invention be produced. A wide variety of designs are possible, for example the second profile sections can perpendicularly adjoin the perpendicular first profile sections or they can adjoin the perpendicular first profile sections with a curve.

Advantageously, the second profile sections have openings which can continue into the contour section. These serve to fix fastening clips that will be described later. Furthermore, the frame profile, similarly to the profile in DE 195 36 950 C1, can be provided with a step that drops in the direction of the connecting web. Furthermore, as in said document, the frame profile can be formed in a symmetrical manner with respect to the cross section diagonal.

The row of holes already addressed above on the contour section does not necessarily have to be present in the flattened region, if the latter is provided at all in the frame profile. However, it is advantageous for the row of holes to comprise openings that are at least partially at a vertical spacing, wherein horizontally extending slots and/or circular openings can be provided. This results in a wide variety of attachment and installation possibilities, which will be discussed later.

Furthermore, provision is advantageously made for the perpendicular first profile sections likewise to be provided with a row of holes. In this configuration, five mounting planes are available simply on account of the mentioned row of holes, which extend perpendicularly or parallel to one another but also, by way of the contour section, at an angle of 45° or 135° to one another.

In order to form the contour section, the curves are essential, wherein the rounded regions can be partial circles, partial ellipses or partial ovals.

In the case of a rack of a switchgear cabinet, which is constructed using the frame profile according to the invention, at least the vertically extending frame profiles should be configured as described above.

It is further advantageous for at least two horizontally extending frame profiles to be frame profiles according to the invention in the bottom region or in the top region of the rack, too. However, in particular in the bottom region, alternative horizontal profiles can also be used, if for example improved stability is important.

The particular advantages of a frame profile according to the present invention arise in being in interaction with a fastening clip which can be attached detachably to the contour section of the frame profile. A suitable fastening clip comprises a mirror-symmetrical body with a U-shaped cross section which has spring-elastic limbs, and is characterized in that the inner contour of the body is selected so as to correspond at least sectionally to the outer contour of the contour section of the frame profile such that the body fits with a friction fit on the contour section, wherein the free ends of the limbs project into the undercut between the two profile sections and the contour section. Given appropriate dimensioning, which is also dependent on the choice of material, of the fastening clip, the latter can be latched onto the contour section of the frame profile and is in principle self-retaining, thus not requiring any additional securing means, for example by way of a screw connection.

Advantageously, the limbs are dimensioned such that when the fastening clip is fitted on the contour section, with the planes of symmetry of the frame profile and the fastening clip corresponding to one another, a spacing remains between the free ends of the limbs and the second profile sections. This means that the fitted fastening clip is pivotable to a limited extent on the contour section, such that an additional degree of freedom, which supplements the axial displaceability along the contour section, is available.

Advantageously, the inner contour of the body has a regular curve, wherein the free ends of the limbs are angled. As an alternative, the limbs can transition into retaining tabs.

Additional mounting possibilities arise when a connection block is attached to the outer contour of the body, said connection block having at least one receptacle for a fastening element. The fastening element can be a constituent part of a component that is required for interior fitting, or a separate fastening element such as a screw, a rivet or the like.

According to a preferred embodiment, two receptacles at an angular spacing of 90° are provided on the connection block. As a result of the use of one or more such fastening clips, a multiplicity of additional mounting planes are thus created.

According to a further embodiment for a fastening clip, at least one holder having a substantially C-shaped cross section may be arranged on the outer contour of the body. Such a holder can for example route the cables in the switchgear cabinet.

To this end, advantageously, a first free end of the holder is secured to the body, while a second free end of the holder remains at a spacing from the outer contour of the body. Thus, the cable to be routed is substantially enclosed, but can easily be threaded through the clearance between the second free end and the outer contour of the body.

It is particularly preferred for a latching device for engaging in a fastening receptacle of the frame profile or in an opening in the contour section of the frame profile to be provided on the connection block.

Yet a further embodiment of the fastening clip comprises a fastening block on the outer contour of the body, said fastening block holding at least one brush strip.

In this case, provision can be made for the at least one brush strip to extend substantially along the axial length of the body.

Advantageously again, two brush strips at an angular spacing of 90° are provided.

A suitable material for the fastening clip, in particular for the body, is plastics material such as polyamide, polyethylene, polypropylene or the like, which, in addition to excellent strength, also provide the necessary elasticity, depending on the wall thickness. Spring steel is also a suitable material.

The fastening possibilities are supplemented when use is made of adapters which are used in conjunction with the receptacle or the receptacles of the connection block of an above-described fastening clip. In this case, the adapters form the interface to a component to be attached, if the latter is not already designed in a corresponding manner from the outset. To this end, the adapter can have a coupling piece that is latchable in the at least one receptacle, or else a coupling opening that is intended to be aligned with the at least one receptacle.

BRIEF DESCRIPTION OF THE DRAWINGS

The invention is intended to be explained in more detail in the following text by way of the appended drawings. The illustrated frame profiles, components etc. are not necessarily drawn to scale and serve merely to explain the principles of the invention in more detail. In the drawings:

FIG. 1b shows a perspective view of the profile according to FIG. 1a;

FIG. 2b shows a perspective view of the profile according to FIG. 2a;

DETAILED DESCRIPTION OF THE INVENTION

Figure 1A:
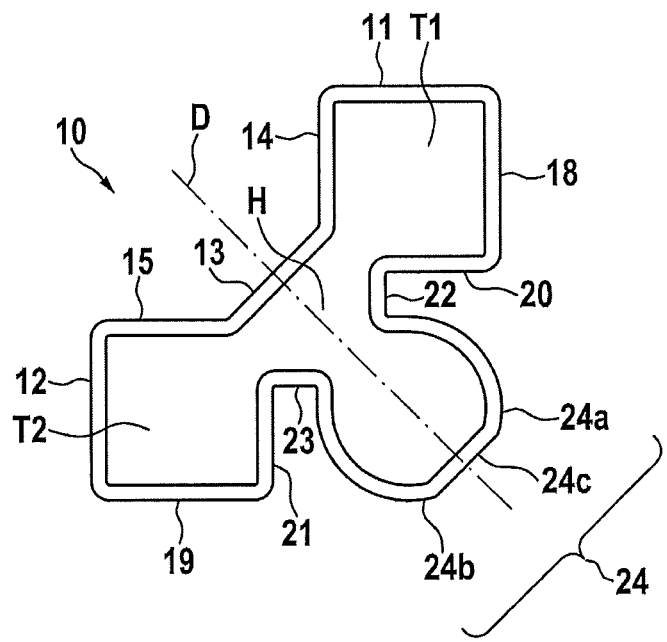
FIG. 1a shows a cross-sectional view of a first embodiment of a frame profile according to the present invention.

FIG. 1a shows a cross-sectional view of a first embodiment of a frame profile 10 for a rack of a switchgear cabinet, said frame profile having two profile sides 11, 12 that are perpendicular to one another and form outer sides of the rack, and being in the form of a hollow profile section. In this case, the profile sides 11, 12 transition into one another via transition sections 14, 15 that are perpendicular thereto and a connecting web 13 without formation of an outer edge. As a result of this contouring, hinges and the like can be fitted in the outer region of the frame profile 10. The profile sides 11, 12 are adjoined, facing away from the transition sections 14, 15, by first profile sections 18, 19 and 20, 21 which are respectively perpendicular and parallel to the associated profile sides 11, 12. Thus, two part chambers T1, T2 are formed within the hollow chamber H, said part chambers T1, T2 not being closed, however, since the parallel first profile sections 20, 21 in this embodiment are shorter than the associated profile sides 11, 12 in a cross-sectional view of the frame profile 10. However, it is also conceivable to lengthen the parallel first profile sections 20, 21 and to design them for example such that the part chambers T1, T2 are closed. This also applies for the embodiments of the frame profiles according to FIGS. 2a and 6.

In FIG. 1a again, the parallel first profile sections 20, 21 are adjoined by second profile sections 22, 23 which transition into a partially rounded contour section 24a, 24b, 24c, designated 24 overall. In the embodiment illustrated, provision is made of rounded regions 24a, 24b which are opposite one another and are connected together by a flattened region 24c. Provision can also be made to form the region 24c in a rounded manner. The second profile sections 22, 23 each form an undercut with the rounded region 24a and 24b, respectively, at the profile outer side. The connecting web 13 is at an angle of 135° to both profile sides, and the flattened region 24c extends parallel to the connecting web 13. Overall, the frame profile 10 is formed in a symmetrical manner with respect to the cross section diagonal D.

Figure 1B:
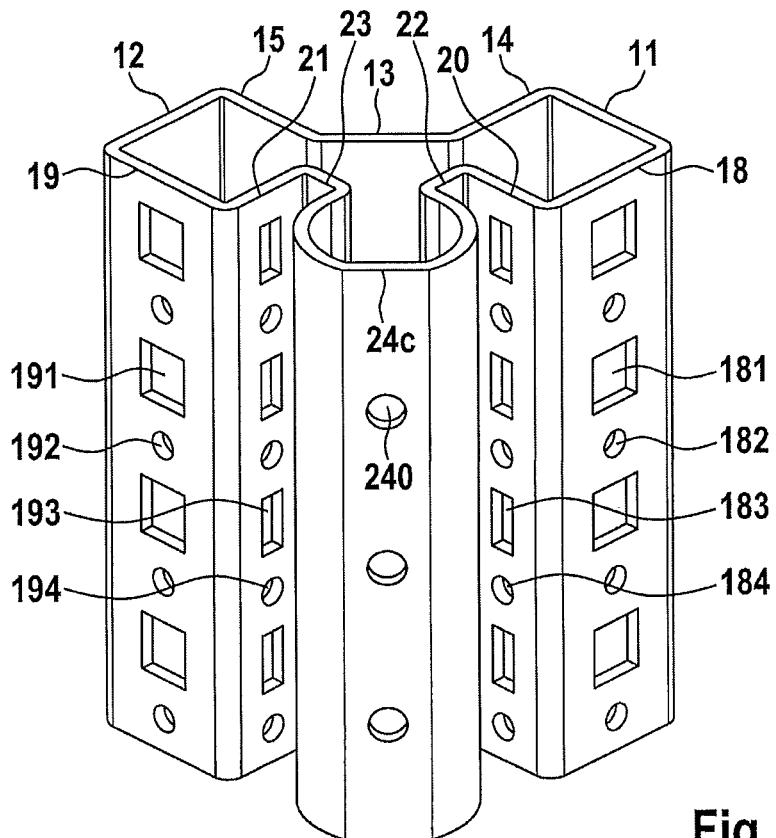

FIG. 1b shows the frame profile from FIG. 1a in a perspective view. The profile sections 18, 19, 20, 21 are each provided with fastening receptacles in the form of a row of holes. In the profile sides 18, 19, this row of holes consists alternately of virtually square openings 181, 191 and circular smaller openings 182, 192 which are arranged vertically one above another in a pitch. The profile sides 20, 21 have fastening receptacles in the form of a hole pitch which consist alternately of openings 183, 193 with a rectangular cross section and circular openings 184, 194 which are likewise arranged in a pitch-like manner. The flattened region 24c has a row of holes which consists only of circular openings 240 that are arranged at an equal spacing from one another in the vertical direction. The rows of holes described result in multifarious fastening possibilities for components, chassis etc., wherein the frame profile provides a total of five mounting planes simply by way of the rows of holes.

Figure 2A:
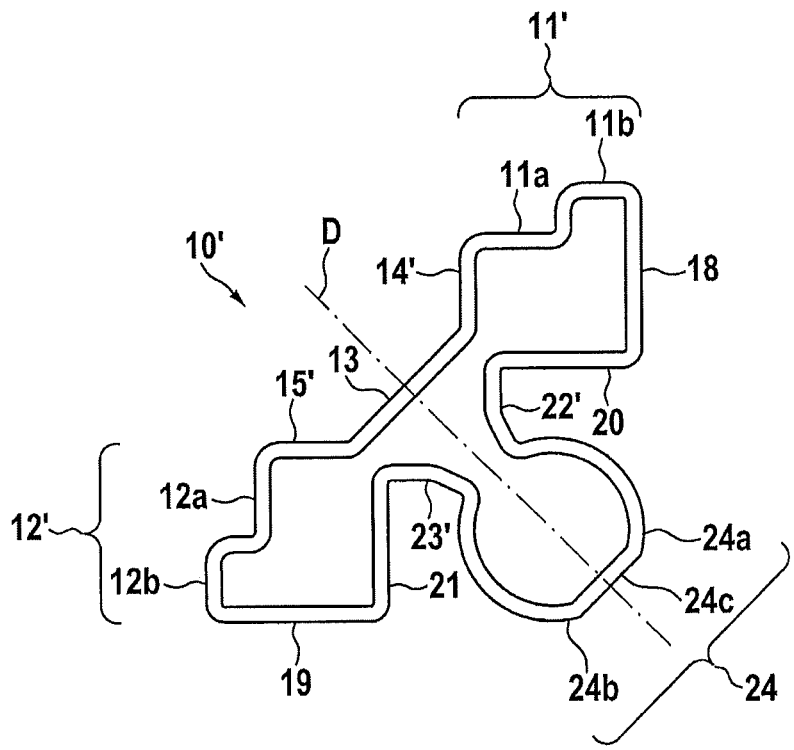
FIG. 2a shows a cross-sectional view of a second embodiment of a frame profile according to the present invention.

FIG. 2a shows a cross-sectional view of a second embodiment of a frame profile 10' according to the present invention, which essentially differs from that of FIG. 1a in that the profile sides 11', 12' and the second profile sections 22', 23' are designed in a different manner. Otherwise, the design corresponds to the one illustrated in FIG. 1, and so the corresponding description will not be repeated. In the frame profile 10' according to FIG. 2a, the profile sides 11', 12' each have a step that drops in the direction of the connecting web 13, said step having regions 11a, 11b and 12a, 12b that are offset with respect to one another, thereby achieving an additional stiffening effect. As a result of the step, the transition sections 14', 15' to the connecting web 13 are correspondingly shortened compared with the profile in FIG. 1a. The second profile sections 22', 23', which form the transition between the profile sections 20, 21 and the contour section 24a and 24b, are rounded in this embodiment, but still ensure the presence of the necessary undercut with respect to the rounded regions 24a and 24b.

Figure 2B:
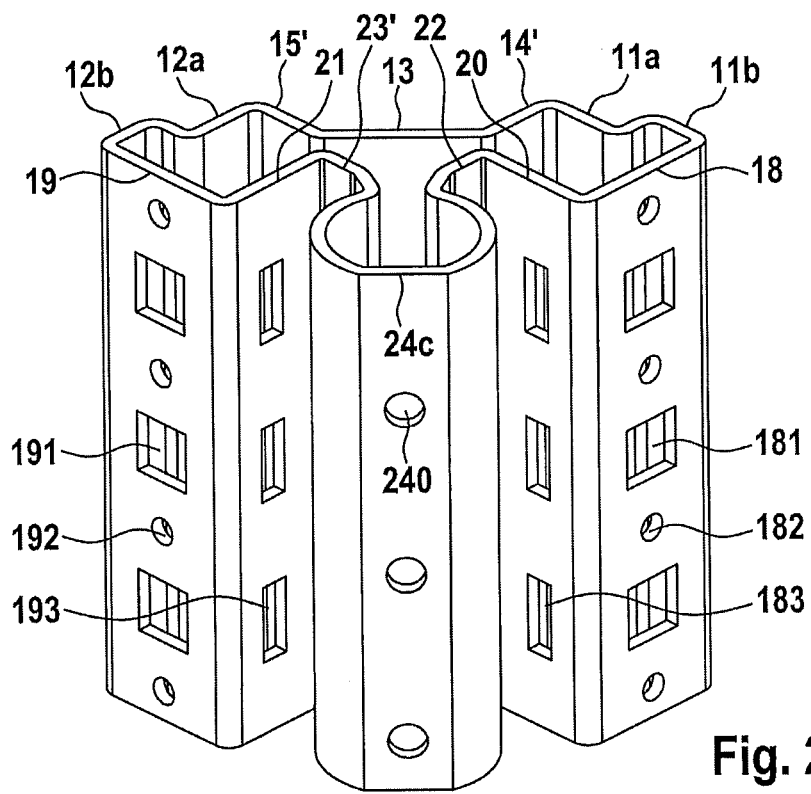

FIG. 2b shows the profile from FIG. 2a in a perspective illustration. The rows of holes in the profile sections 18, 19 and the flattened region 24c are formed in a manner corresponding to the embodiment in FIG. 1b. The rows of holes in the profile sections 20, 21 now contain only openings having a rectangular cross section 183, 193 which extend at an equal spacing from one another in the vertical direction.

In the following text, the invention is frequently described with reference to a frame profile which has a cross section according to FIG. 1a. However, it goes without saying that frame profiles having a cross section according to FIG. 2a can be used in equal measure, as can frame profiles which have a rounded region 24c rather than a flattened one. The type and position of the fastening receptacles can also vary and differ from those which can be seen in FIGS. 1b and 2b.

When a profile section without fastening receptacles is illustrated, provision can nevertheless be made for these to be provided.

Figure 3:
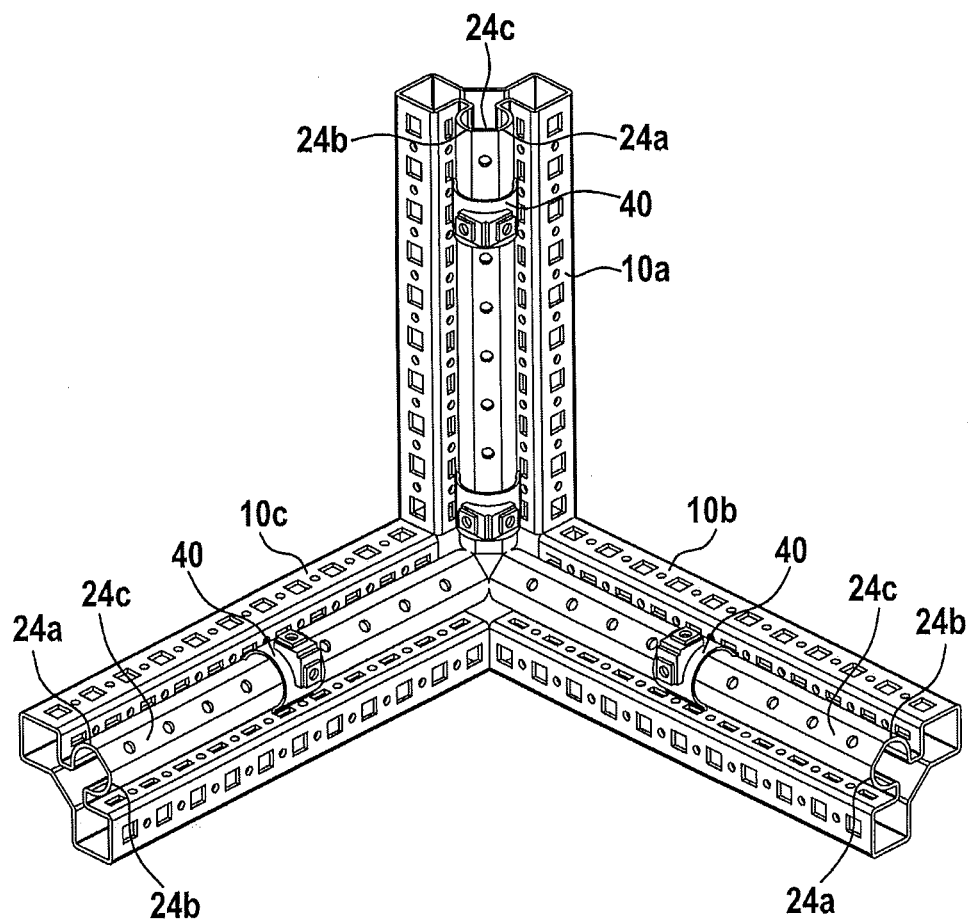
FIG. 3 shows a corner region of a rack constructed from three frame profiles according to the present invention.

FIG. 3 shows a perspective illustration of a corner region of a rack which is formed from three frame profiles 10a, 10b and 10c having a cross section according to FIG. 1a. The frame profiles 10a, 10b, 10c can be welded directly together or coupled by a corner connector and then welded. Fitted onto the contour sections 24a, 24b, 24c of the frame profiles 10a, 10b, 10c are fastening clips 40 which are described in more detail in conjunction with FIG. 4. The fastening clips 40, yet further embodiments and variants of which are described in the following text, allow, together with the contouring of the frame profiles according to the invention, a novel mounting concept for the largely toolless interior fitting of a rack or of a switchgear cabinet.

Figure 4:
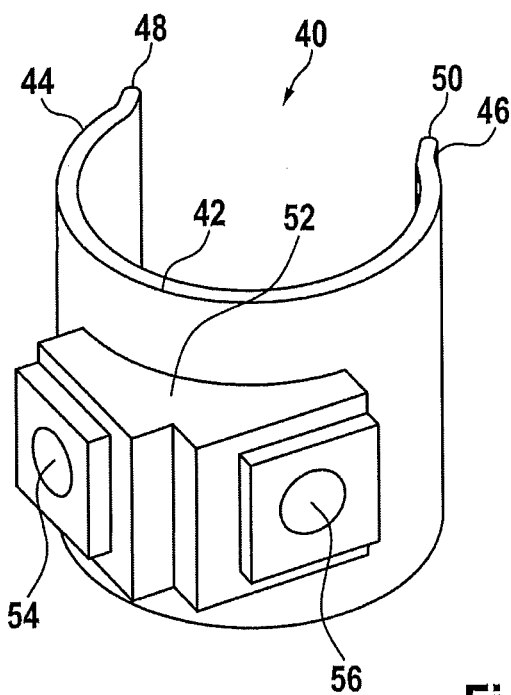
FIG. 4 shows a perspective view of a first embodiment of a fastening clip according to the present invention.

FIG. 4 shows a fastening clip 40 which is designed for detachable attachment to a frame profile, for example according to FIG. 1a or FIG. 2a, according to the present invention. The fastening clip 40 has a mirror-symmetrical body 42 with a substantially U- or C-shaped cross section, the spring-elastic limbs 44, 46 of which lead into free ends 48, 50 which are angled away from the limbs 44, 46. The inner contour of the body 42 corresponds at least sectionally to the outer contour of the contour section 24 of a frame profile and is chosen such that the body 42 fits with a friction fit on the contour section 24. When a contour section 24 has a flattened region 24c, as illustrated in FIGS. 1a and 2a, there is no friction fit at that point. The limbs 44, 46 are dimensioned such that when the fastening clip 40 is fitted on the contour section 24, with the planes of symmetry of the frame profile and fastening clip 40 corresponding to one another, a spacing remains between the free ends 48, 50 of the limbs 44, 46 and the second profile sections 22, 23 (FIG. 1a) or 22', 23' (FIG. 2a). This dimensioning makes it possible for the fastening clip 40, when it is fitted on the contour section 24, to be rotatable through a limited angular range. Rotatability is favoured when the inner contour of the body 42 has a regular curve. Fitted to the outer contour of the body 42 is a connection block 52 which has two receptacles 54, 56 in each case for a fastening element. The two receptacles 54, 56 are provided in the connection block 52 at an angular spacing of 90° and are in the form of cylindrical bores. As a result, the mounting possibilities increase once again, and retrofits and refits are also easy to effect. The fastening clip 40 can be fitted to any desired point on the contour section 24 of a frame profile and be moved in a floating manner along the latter.

Figure 5:
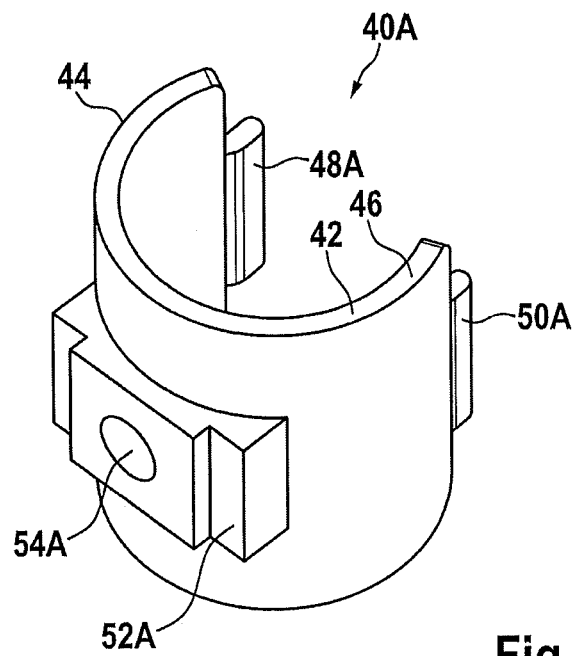
FIG. 5 shows a perspective view of a second embodiment of a fastening clip according to the present invention.

FIG. 5 shows a perspective view of a second embodiment of a fastening clip 40A, the body 42 of which is again mirror-symmetrical with a substantially U- or C-shaped cross section, but the spring-elastic limbs 44, 46 of which transition in this case into retaining tabs 48A, 50A which are arranged centrally on the limbs 44, 46 and project in front of the latter. Provision is still made on the body 42 of a connection block 52A having only one receptacle 54A, said connection block 52A being arranged in a mirror-symmetrical manner with respect to the plane of symmetry of the body 42. Such a fastening clip 40A can likewise be fitted on the contour section 24 of a frame profile and be moved in a floating manner along the latter, but, as a result of the retaining tabs 48A, 50A, affords the possibility of fixing when use is made of a frame profile that is modified compared with the embodiments in FIG. 1a or FIG. 2a.

Figure 6:
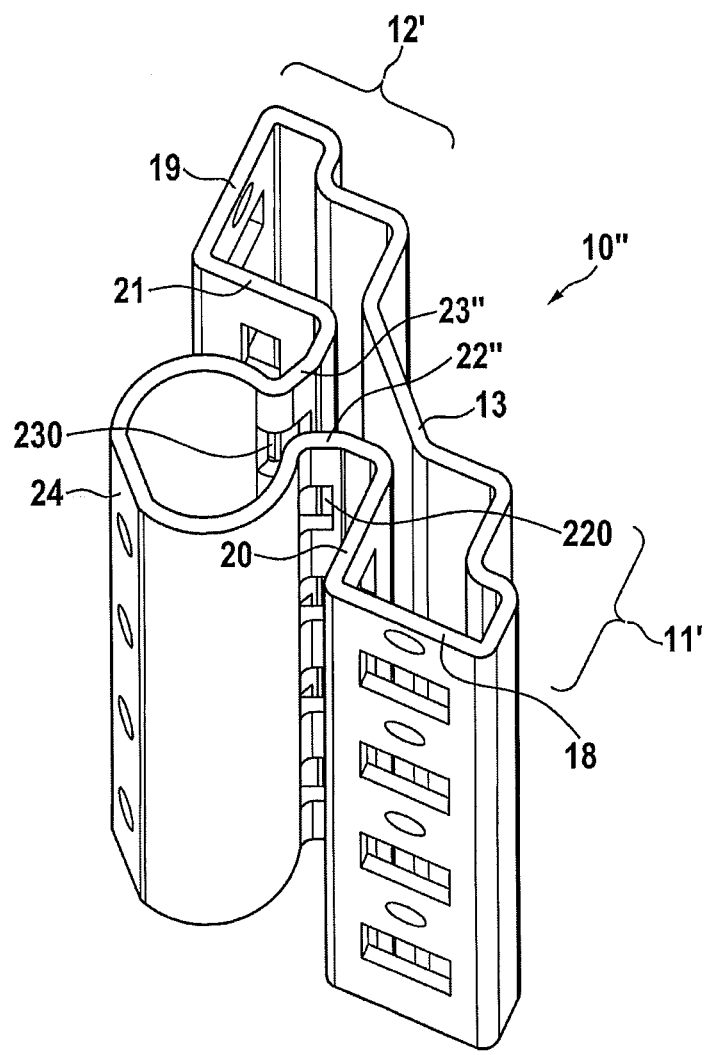
FIG. 6 shows a perspective view of a third embodiment of a frame profile according to the present invention.

FIG. 6 shows a perspective view of such a modified frame profile 10" which is derived from the frame profile 10' in FIG. 2a. It corresponds to the frame profile 10' in terms of the configuration of the profile sides 11', 12', of the connecting web 13, of the transition sections 14', 15', of the profile sections 18, 19, 20, 21 and of the contour section 24, and so reference is made to the description made in this regard. However, unlike in the embodiment according to FIG. 2a, the second profile sections 22", 23", which each adjoin the contour section 24, have a row of holes with apertures 220, 230 having dimensions adapted to the dimensions of the retaining tabs 48A, 50A of a fastening clip 40A according to FIG. 5. It goes without saying that the frame profile 10 in FIG. 1a can be modified in an identical manner.

Figure 7:
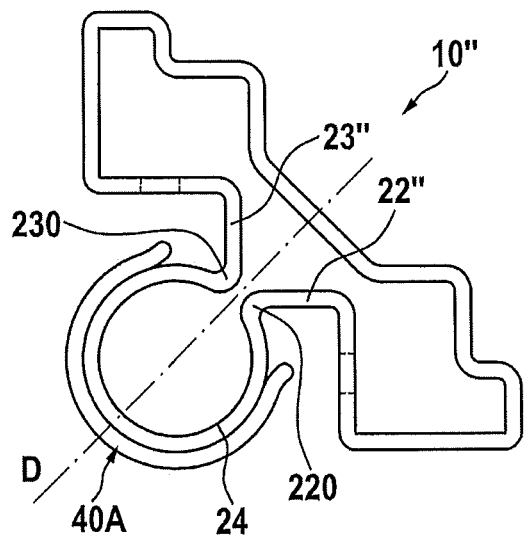
FIG. 7 shows a cross-sectional view of the profile from FIG. 6 with a fitted fastening clip.
Figure 8:
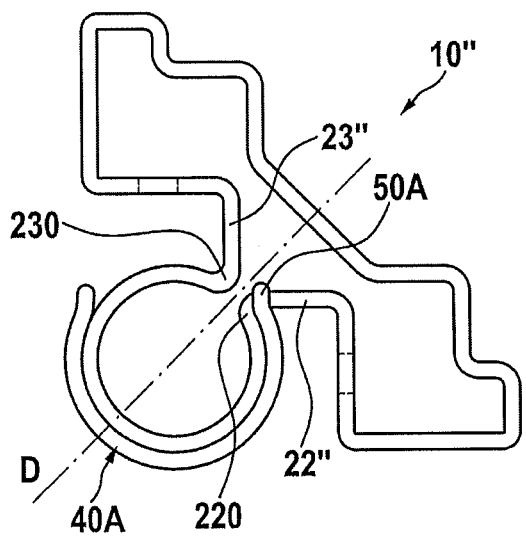
FIG. 8 shows a cross-sectional view of the profile from FIG. 6 with a fitted and latched fastening clip.

FIG. 7 shows a cross-sectional view of the profile from FIG. 6 with a fastening clip 40A fitted on the contour section 24. In this position, that is to say substantially symmetrically with respect to the plane of symmetry D of the frame profile 10" or rotated through a small angle therefrom, the fastening clip 40A can again be moved along the contour section 24 until the desired mounting position has been reached. There is then the possibility of fixing the fastening clip 40A to the frame profile 10" in that, as illustrated in FIG. 8, for example the retaining tab 50A of the fastening clip 40A is guided into one of the apertures 220 in the profile section 22". Depending on the configuration of the retaining tabs 48A, 50A, there can also be the option of a latching connection. FIGS. 7 and 8 show particularly clearly that the apertures 220, 230 in the profile sections 22", 23" continue into the contour section 24. However, provision can also be made to provide the apertures 220, 230 exclusively in the profile sections 22", 23".

Figure 9:
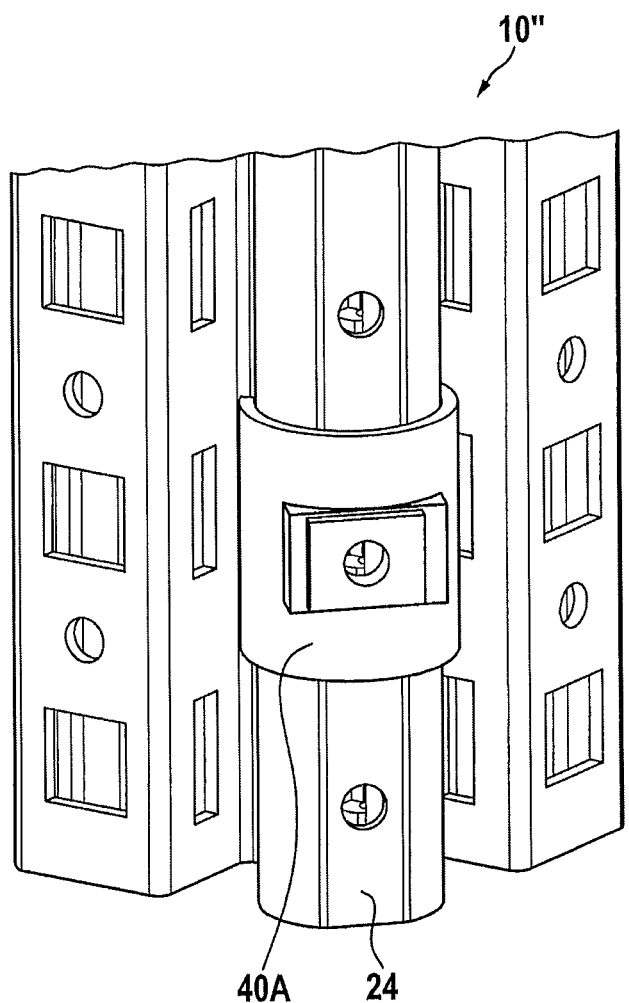
FIG. 9 shows a plan view of the frame profile from FIG. 6 with a fitted fastening clip.

FIG. 9 shows a plan view of the frame profile 10" from FIG. 6 with a fastening clip 40A fitted onto the contour section 24 but not yet fixed, said fastening clip 40A, as illustrated here, being vertically displaceable such that it can be moved into a desired vertical position on the frame profile 10".

Figure 10:
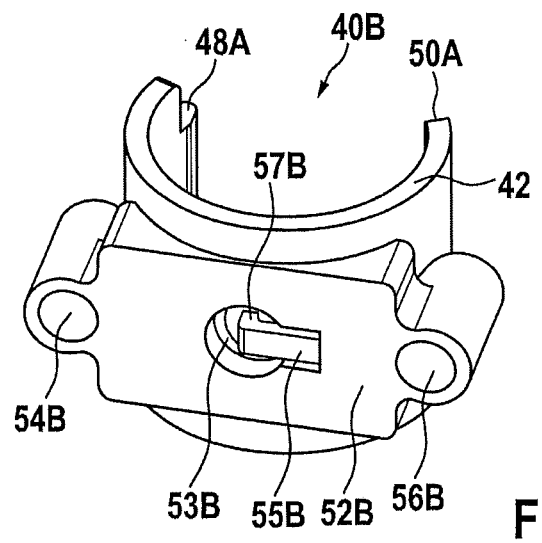
FIG. 10 shows a perspective view of a third embodiment of a fastening clip according to the present invention.

FIG. 10 shows a perspective view of a third embodiment of a fastening clip 40B according to the present invention, the body 42 of which likewise has the retaining tabs 48A, 50A of the fastening clip 40A in FIG. 5, but which additionally allows what is known as central latching, in the case of which the fastening clip 40B is fitted in a symmetrically fixed manner on the contour section 24. To this end, a connection block 52B is attached to the body 42, said connection block 52B having a central opening 53B which continues through the body 42. A latching arm 55B that is formed integrally with the connection block 52B and has a latching lug 57B that is angled therefrom and extends through the opening 53B and beyond the body 42 in the unloaded state projects into the opening 53B. In the fastening clip 40B, receptacles 54B, 56B are furthermore provided on both sides of the opening 53B and at a spacing therefrom.

Figure 11:
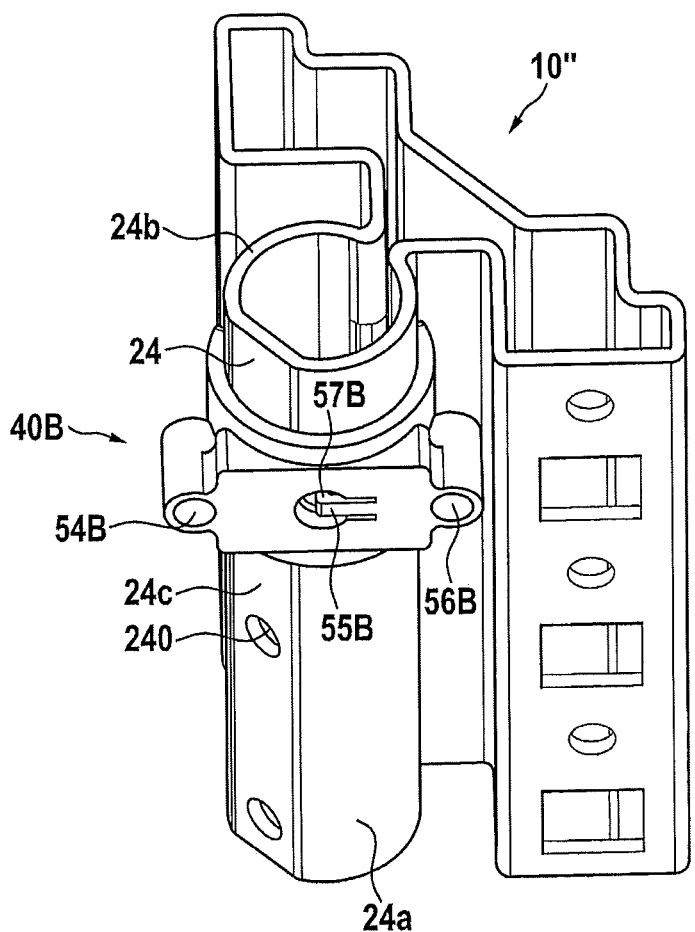
FIG. 11 shows a perspective view of a frame profile according to the present invention with a fastening clip according to FIG. 10.

FIG. 11 shows a perspective view of a frame profile 10" having a fastening clip 40B according to FIG. 10 fitted on the contour section 24. As long as the fastening clip 40B is intended to remain displaceable, it is rotated or positioned such that the latching lug 57B is located over one of the rounded regions 24a (or 24b) which are not provided with a perforation. Thus, the latching lug 57B slides over the surface of the rounded regions 24a or 24b, wherein preloading under the spring force of the latching arm 55B takes place. When the desired mounting position has been reached, the fastening clip 40B is rotated such that the latching lug 57B passes over the flattened region 24c of the contour section 24 which, as described in connection with FIG. 1b, has a row of holes composed of spaced-apart openings 240. As soon as the latching lug 57B reaches a suitable opening 240, it jumps into the latter under the preloading by the latching arm 55B and now retains the fastening clip 40B by way of the latching in a central position on the contour section 24 in which the receptacles 54B, 56B are located symmetrically next to the rounded regions 24a, 24b. It goes without saying that this central latching is independent of the presence of retaining tabs 48A, 50A.

Figure 12:
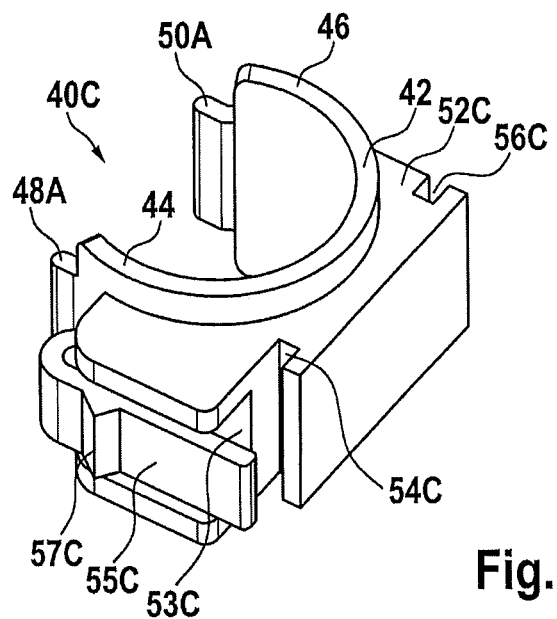
FIG. 12 shows a perspective view of a fourth embodiment of a fastening clip according to the present invention.

FIG. 12 shows a perspective view of a fourth embodiment of a fastening clip 40C according to the present invention. The fastening clip 40C again has a mirror-symmetrical body 42 having a substantially U- or C-shaped cross section, the spring-elastic limbs 44, 46 of which, as in the embodiment according to FIG. 5, transition into retaining tabs 48A and 50A. A connection block 52C engages almost entirely around the body 42 and has, on at least one of its sides, for example the one which rests against the limb 44, as illustrated in FIG. 12, a recess 53C into which a resilient latching tongue 55C secured to the connection block 52C can be pushed. The latching tongue 55C has a protruding latching lug 57C which is directed away from the body 42 of the fastening clip 40C. Furthermore, two parallel spaced-apart guide grooves 54C, 56C are provided on the connection block 52C and are intended for receiving retaining elements for components to be attached. The connection block 52C having the latching tongue 55C is matched in terms of its dimensions to a frame profile for example according to FIG. 6.

Figure 13:
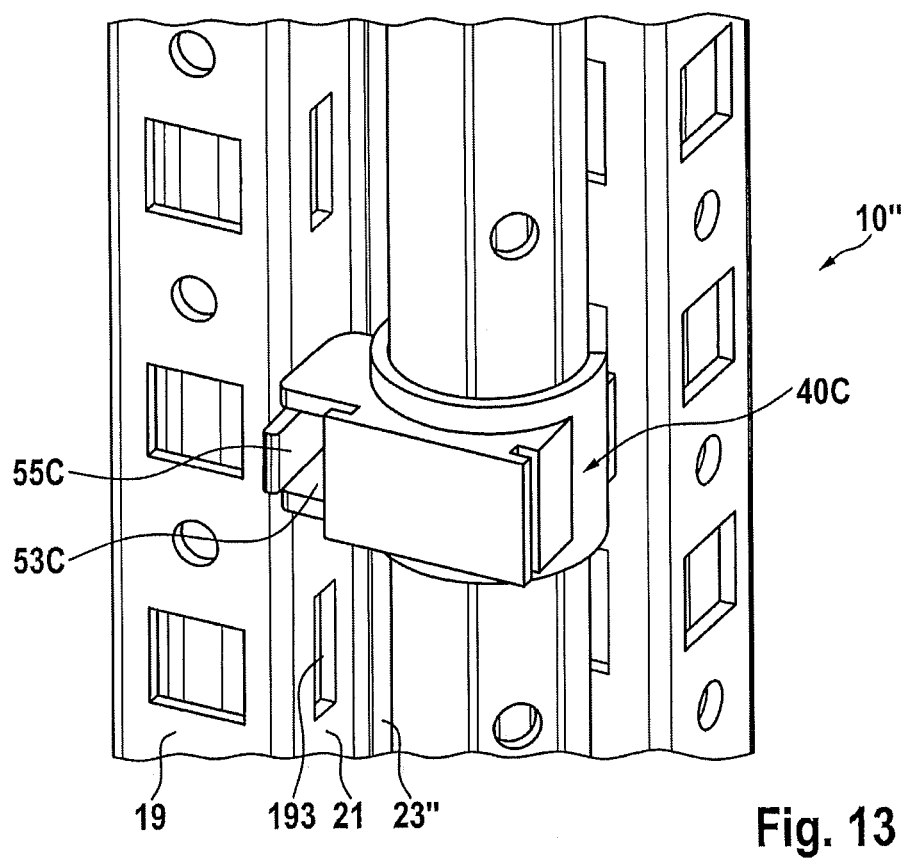
FIG. 13 shows a perspective side view of a frame profile according to the present invention with a fastening clip according to FIG. 12.

FIG. 13 shows a perspective side view of a frame profile 10" according to FIG. 6 with a fastening clip 40C according to FIG. 12 which is fitted on the contour section 24 and already latched. To this end, the fastening clip 40C is moved, by displacement, rotation and/or positionally accurate plugging, into a position in which the latching lug 57C comes to rest in one of the openings 193 having a rectangular cross section which have been introduced into the profile section 21. Given a corresponding design, one of the retaining tabs (in this case the non-visible retaining tab 48A, FIG. 12) can simultaneously pass into one of the apertures in the profile section 23". However, in principle, the described latching connection is independent of the presence of retaining tabs. The latching tongue 55C projects beyond the profile sections 21 and 19 and can therefore be pushed easily into the recess 53C by the fitter in order to release the latching lug 57C from the opening 193 such that the fastening clip 40C can then be removed from the frame profile 10".

Figure 14:
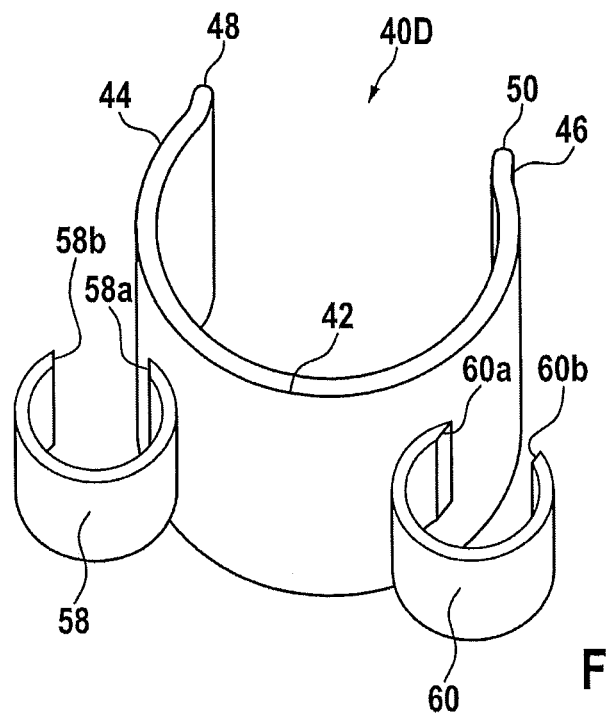
FIG. 14 shows a perspective view of a fifth embodiment of a fastening clip according to the present invention.

FIG. 14 shows a fifth embodiment of a fastening clip 40D which can be used with a frame profile according to the present invention. The fastening clip 40D corresponds substantially to the fastening clip 40 in FIG. 4 and has, like the latter, a body 42 having limbs 44, 46, the free ends 48, 50 of which are angled. Instead of the connection block 52 (FIG. 4), two holders 58, 60 having a substantially C-shaped cross section are arranged on the outer contour of the body 42. In principle, any desired orientation of the holders 58, 60 on the body 42 is possible, but provision is made here for a first free end 58a, 60a of each holder 58, 60 to be secured to the body 42, while a second free end 58b, 60b of the holder 58, 60 remains at a spacing from the outer contour of the body 42. Thus, the U-shaped cross section of the body 42 and the C-shaped cross sections of the holders 58, 60 open in the same direction. The holders 58, 60 serve to route the cables or lines within the switchgear cabinet, wherein, on account of the C-shaped cross section of the holders 58, 60, it is not necessary to thread said cables or lines through, but rather the latter can easily be pushed through the gap between the ends 58a, 58b and 60a, 60b into the respective holder 58, 60.

Figure 15:
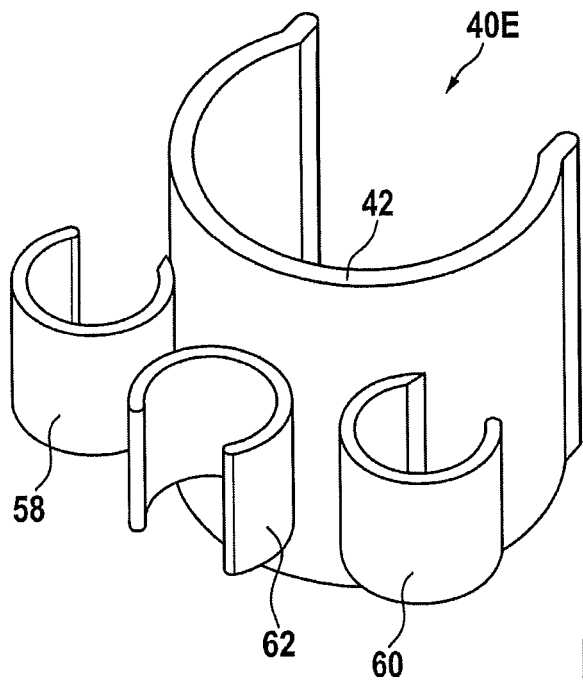
FIG. 15 shows a perspective view of a variant of the fastening clip from FIG. 14.

A variant is shown in FIG. 15, in which, on the fastening clip 40E, the structure of which otherwise corresponds to that of the fastening clip 40D, a further holder 62 having a C-shaped cross section is arranged centrally between the holders 58, 60 on the body 42, said further holder 62 opening in the opposite direction compared with the holders 58, 60.

Figure 16:
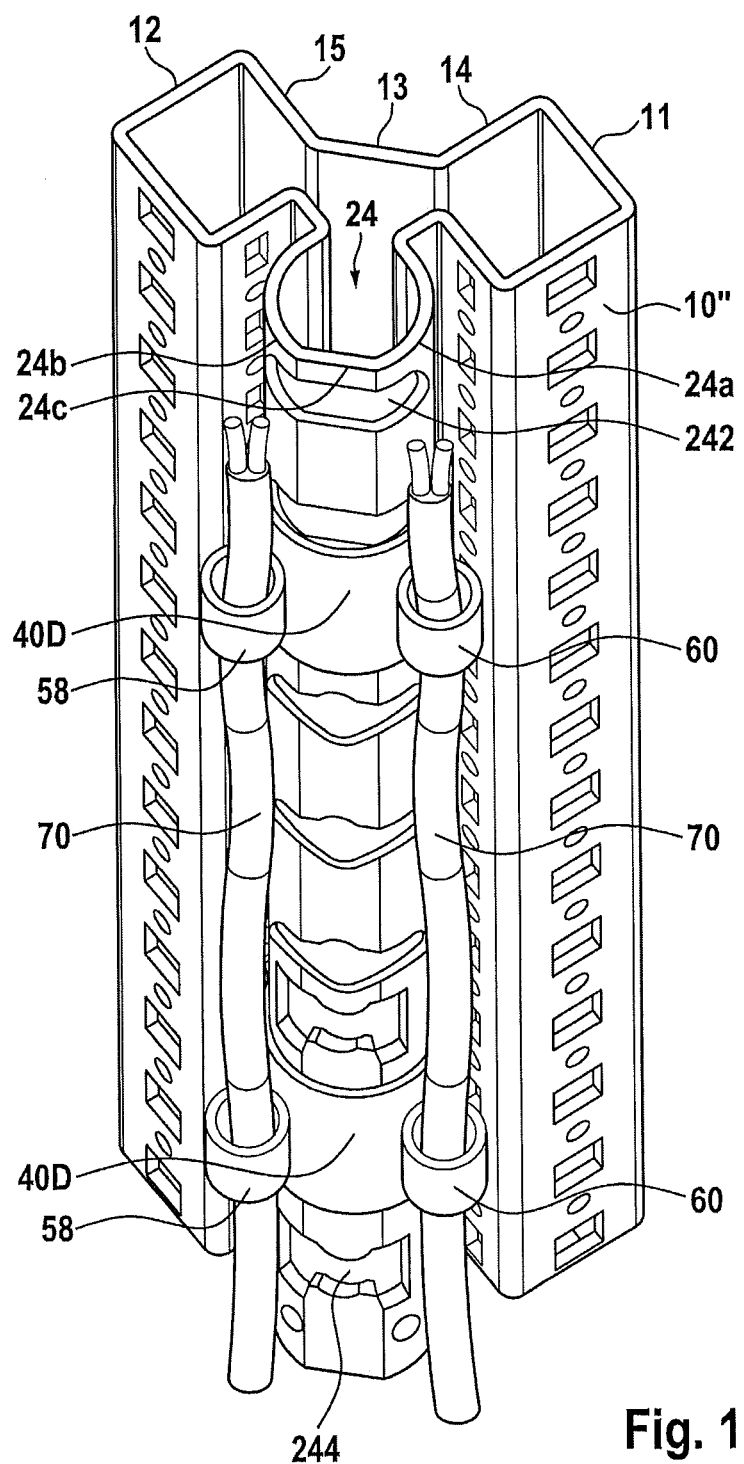
FIG. 16 shows two fastening clips according to FIG. 14 attached to a frame profile according to the present invention for cable routing.

FIG. 16 shows an arrangement having a frame profile 10" according to the invention, onto the contour section 24 of which two fastening clips 40D according to FIG. 14 have been fitted. The fastening clips 40D are spaced apart from one another and, depending on the length of the frame profile 10", further fastening clips 40D can be provided. Cables 70 are guided through the holders 58, 60 and thus extend along the contour section 24. The flattened region 24c has horizontal slots 242, 244 that are spaced apart in the vertical direction, have different cross sections and can be used to mount accessory parts such as brackets, further holders etc.

Figure 17:
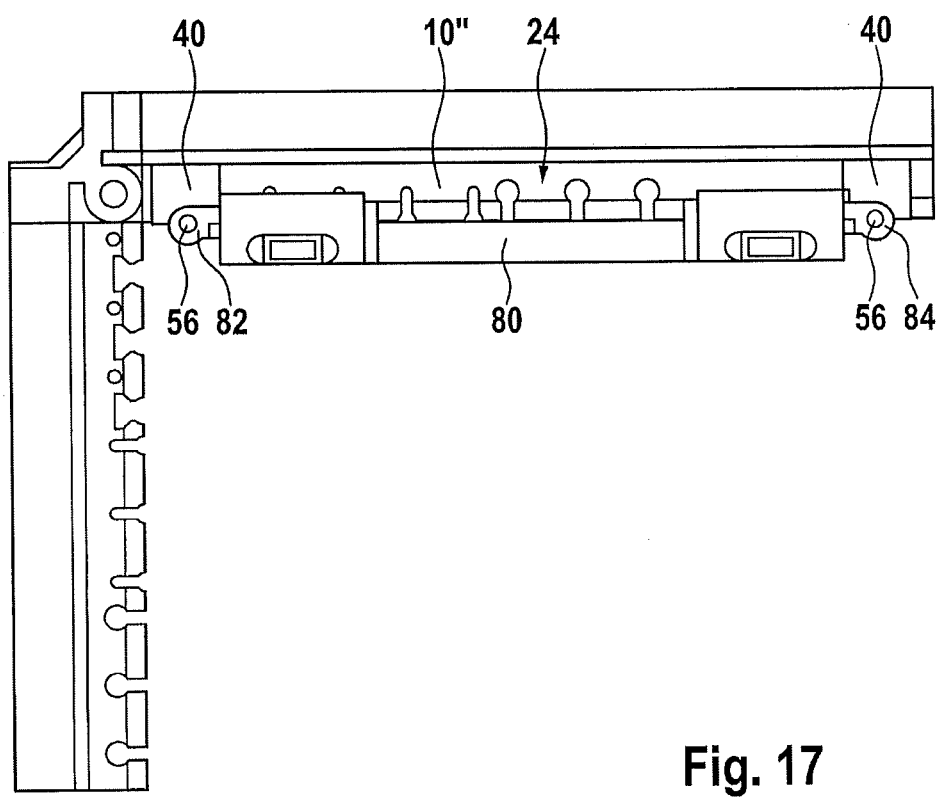
FIG. 17 shows a switchgear cabinet lamp mounted with the aid of the fastening clips according to FIG. 4.

FIG. 17 shows a further use of the fastening clips according to FIG. 4 in interaction with a frame profile 10, 10', 10" according to the present invention. In this case, two fastening clips 40 have been plugged onto a frame profile, for example 10' according to FIG. 2a. Located over the receptacles 56 of the fastening clips 40 are corresponding flanges 82, 84 of a switchgear cabinet light 80, wherein fastening can take place for example by way of a self-tapping screw. Since the fastening clips 40 are pivotable through a certain angle, an optimal position, for example in the top region of a rack, can be found for the switchgear cabinet lamp 80.

Figure 18:
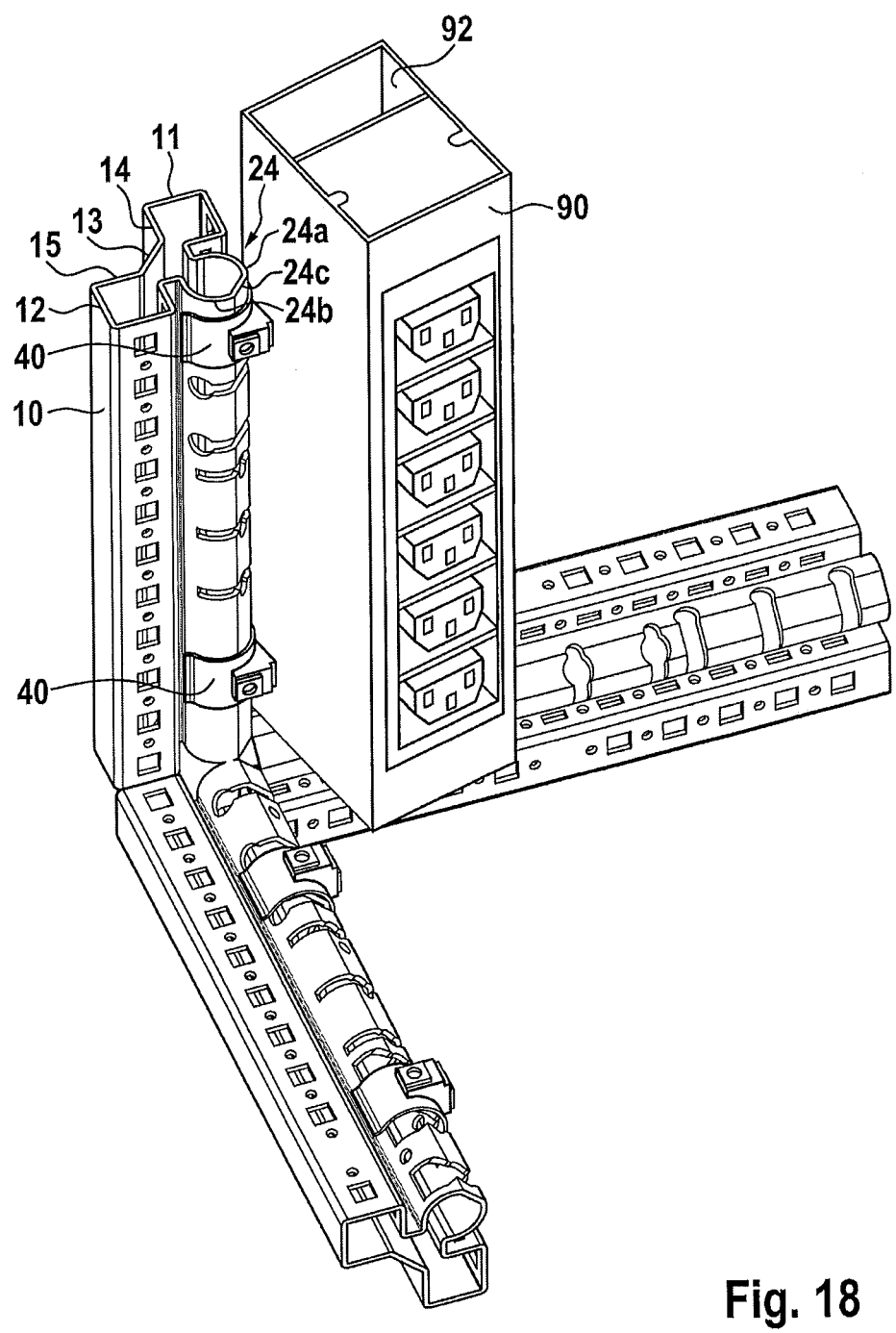
FIG. 18 shows a multiple socket outlet mounted with the aid of the fastening clips according to FIG. 4.

FIG. 18 shows a further possible use of fastening clips 40 according to FIG. 4 in interaction with a rack according to the invention, for example 10 according to FIG. 1a. Two fastening clips 40 are first of all secured to a receiving housing 92, for example by screw connection. A multiple socket outlet 90 is then pushed into the receiving housing 92. Finally, the fastening clips 40 are pushed onto the contour section 24 of the vertical frame profile 10. Here too, it proves to be advantageous for the fastening sections to be pivotable through a certain angle about the contour section 24 such that an optimal position for the multiple socket outlet 90 can be found. It can also be pivoted for example out of the installation region of the rack if additional components are intended to be installed.

Figure 19:
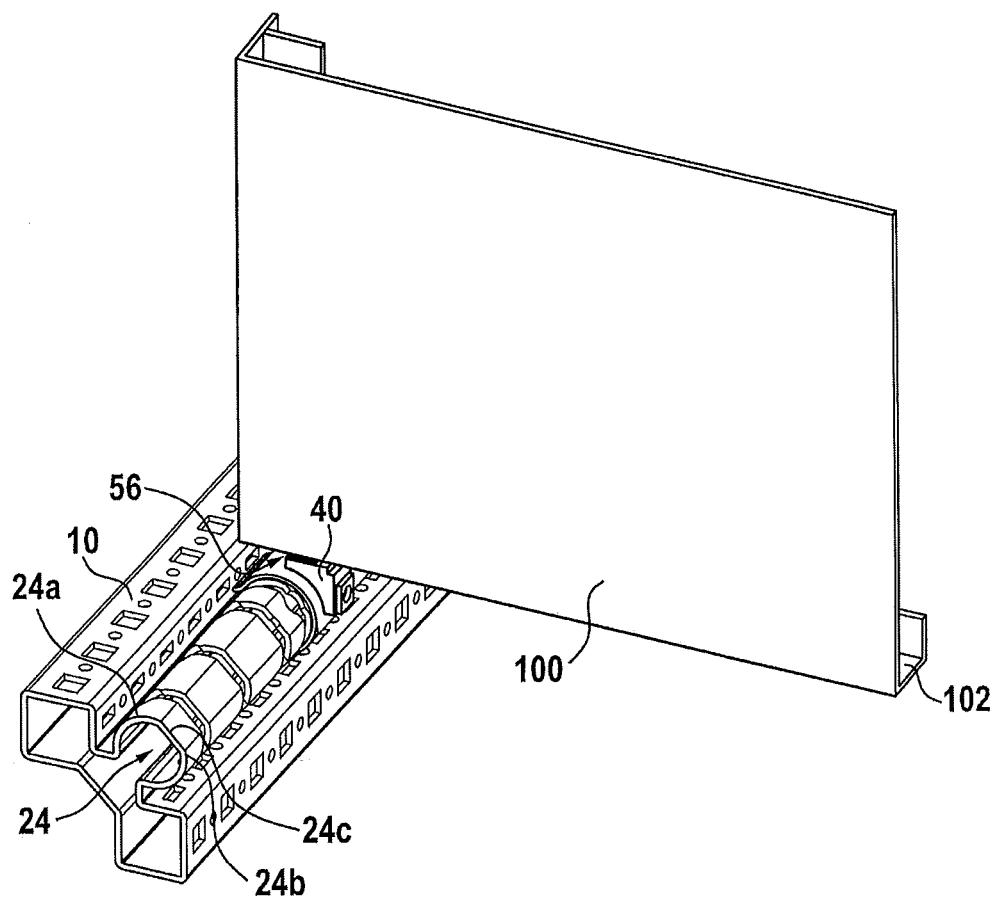
FIG. 19 shows a mounting panel installed with the aid of the fastening clip according to FIG. 4.

FIG. 19 shows a further possible use of a fastening clip 40 according to FIG. 4, specifically in order to fasten a mounting panel 100 to a frame profile, for example 10 according to FIG. 1, or to the contour section 24 thereof. The mounting panel 100 has a fold 102 which (not visible) is provided with a bore such that, by means of a screw, fastening in the receptacle 56 of the fastening clip 40 can take place. Then, the mounting panel 100 is fitted together with the fastening clip 40 onto the contour section 24 of the frame profile 10. Since the fastening clip 40 is held on the contour section 24 only by a friction fit, it is displaceable, together with the mounting panel 100, along the contour section 24 such that the optimal position for the mounting panel 100 can be set up and optionally also changed.

In the possible uses described hitherto, the requirements for mounting have been met by special adaptations to the components, for example to the switching cabinet light 80 according to FIG. 17, the multiple socket outlet 90 according to FIG. 18 or the mounting panel 100 according to FIG. 19. However, it is also possible to carry out the adaptation with the aid of adapters.

Figure 20:
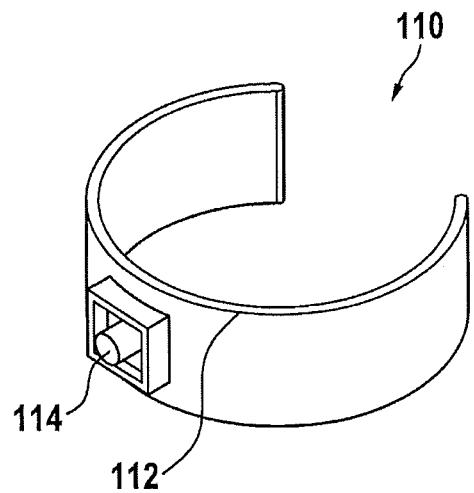
FIG. 20 shows a first embodiment of an adapter for a fastening clip according to FIG. 4 or 5.

FIG. 20 shows a first embodiment of such an adapter 110, which is intended for holding pipes or pipe sections having a circular cross section. Therefore, the body 112 of the adapter has a non-closed part-ring having a circular cross section, wherein the dimensions are designed such that the body 112 encloses with its spring force the pipe to be attached. The body 112 furthermore has a latching peg 114 which protrudes from the outer side of the body 112. This latching peg 114 can be latched into one of the receptacles 54 or 56 in a fastening clip 40 according to FIG. 4 or 40A according to FIG. 5.

Figure 21:
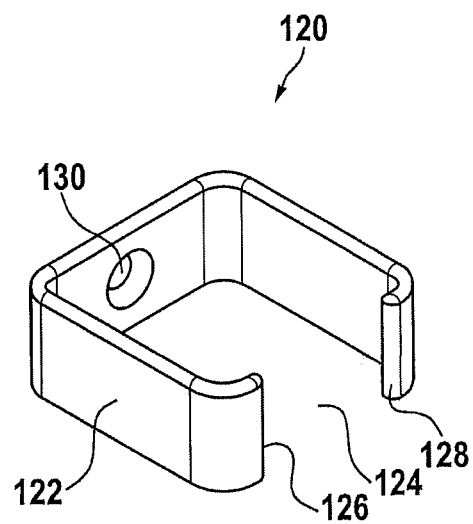
FIG. 21 shows a second embodiment of an adapter for a fastening clip according to FIG. 4 or 5.

An alternative form of an adapter for holding pipes having a substantially square cross section is shown in FIG. 21. The cross section of the body 122 corresponds substantially to the cross section of the pipe to be inserted and, for tolerance compensation, provision is made for the body 122 not to be closed but for an opening 124 to remain between two free ends 126, 128. Connection to a fastening clip 40 according to FIG. 4 or 40A according to FIG. 5 takes place in that an opening 130, which is located opposite the opening 124, is aligned with one of the receptacles 54, 56 in a fastening clip 40. Then, fastening can take place for example with the aid of a self-tapping screw.

Figure 22:
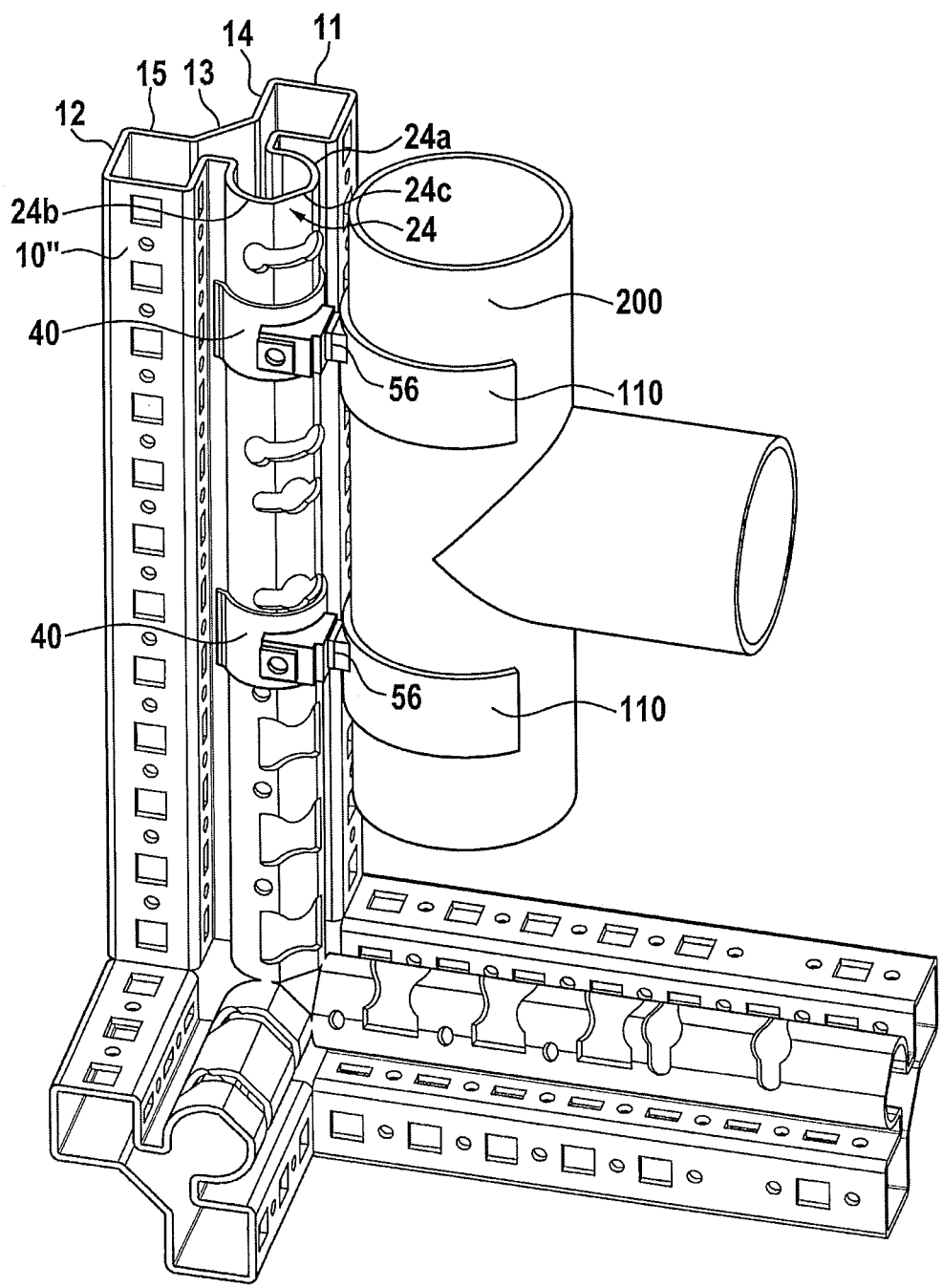
FIG. 22 shows the mounting of a pipe on a frame profile with the aid of the fastening clip according to FIG. 4 and the adapter according to FIG. 20.

FIG. 22 shows a means for mounting duct elements for partial air conveyance, using fastening clips 40 according to FIG. 4 and adapters 110 according to FIG. 10. For mounting on a vertical frame profile 10″ or the contour section 24 of which, first of all adapters 110 are plugged for example onto a T-pipe 200, as illustrated in FIG. 12. The latching pegs (114 in FIG. 20) of the adapters 110 are then latched into receptacles 56 in two fastening clips 40 according to FIG. 4. Finally, the fastening clips are plugged onto the contour section 24 of the frame profile 10″. The pipe can be pushed onto the contour section 24 or be pivoted about the latter.

Figure 23:
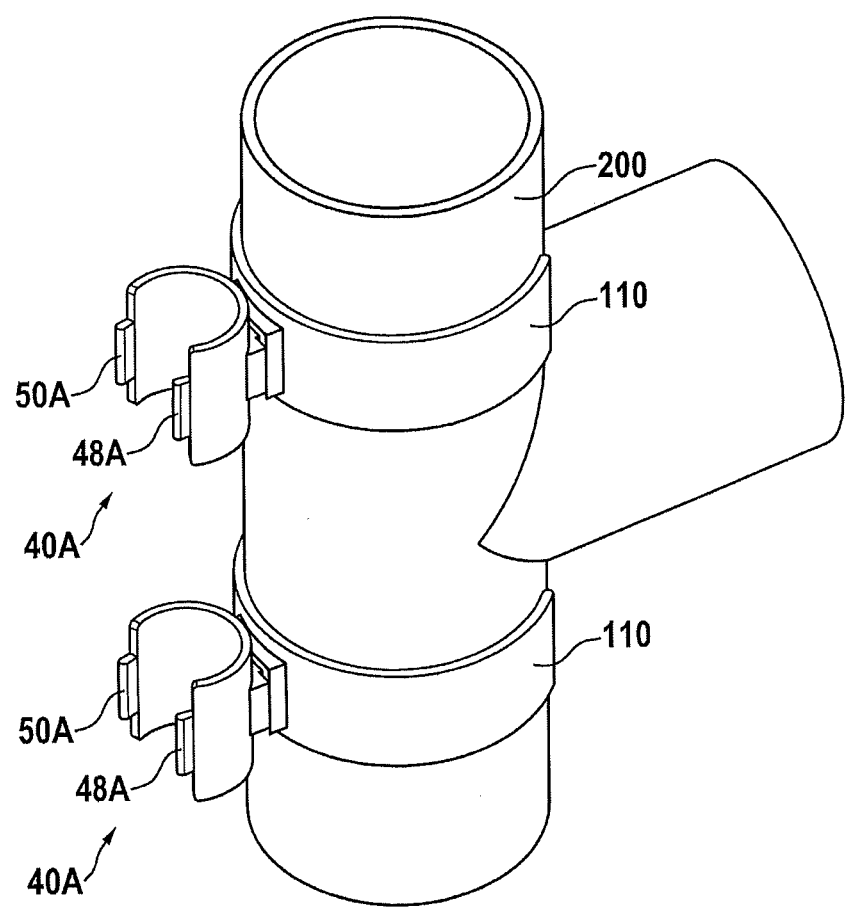
FIG. 23 shows a variant for the mounting of a pipe with the aid of the fastening clip according to FIG. 5 and the adapter according to FIG. 20.

FIG. 23 shows a variant in which fastening clips 40A according to FIG. 5 are inserted together with adapters 110 for holding the T-pipe 200 such that now it is also possible to fix the structure by the interaction of the respective retaining tabs 48A, 50A with the frame profile.

The described concept for air conveyance can also be used in racks in a situation in which the latter are mounted side-by-side.

Figure 24:
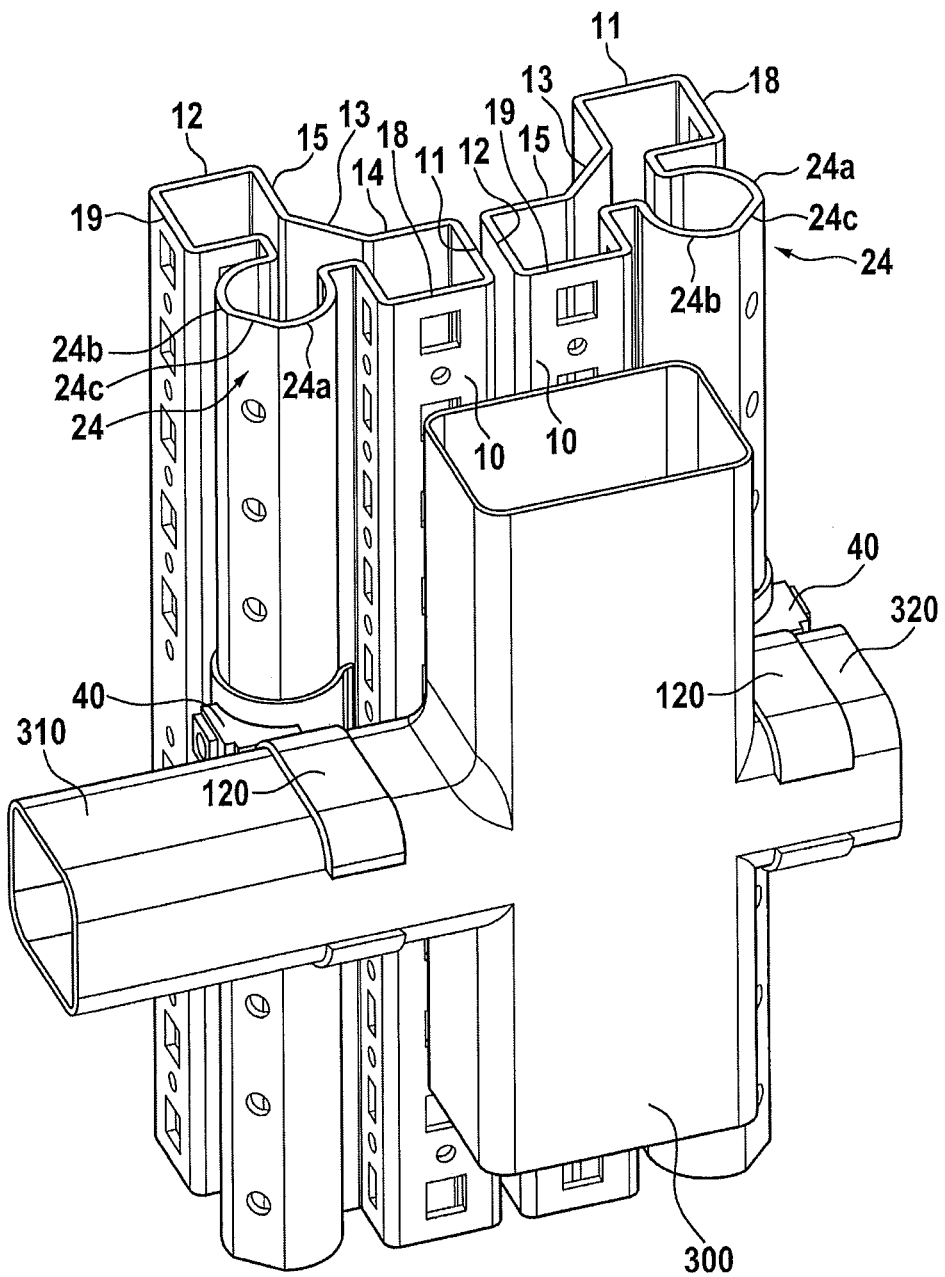
FIG. 24 shows the mounting of a pipe with the aid of the fastening clip according to FIG. 4 and the adapter according to FIG. 21, wherein the situation of mounting two racks side-by-side is likewise illustrated in a simplified manner.

FIG. 24 shows to this end two vertical frame profiles 10 according to FIG. 1, which are constituent parts of a respective rack, wherein the racks are intended to be mounted side-by-side. Accordingly, the racks have to be moved together such that respective profile sides 11, 12 are located opposite one another. Any necessary seals are not shown. In order to mount a distributor pipe 300, first of all adapters 120 according to FIG. 21 are screwed together with fastening clips 40 according to FIG. 4 and then plugged onto the contour sections 24. A distributor pipe section 310 is pushed into the adapter 120 before the racks are mounted side-by-side. When the racks are then moved together in order to be mounted side-by-side, the pipe extension 320 reaches the adapter 120 of the rack and can be pushed into said adapter. Since the fastening clips 40 are displaceable in the vertical direction on the contour sections 24, tolerance compensation is readily possible when racks are mounted side-by-side.

Figure 25:
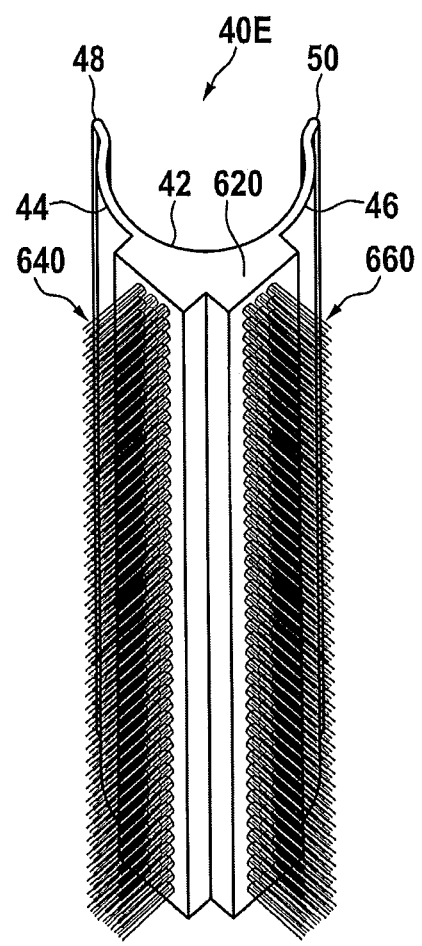
FIG. 25 shows a sixth embodiment of a fastening clip.

FIG. 25 shows a sixth embodiment of a fastening clip 40E, which in turn has a body 42 having two mutually opposite spring-elastic limbs 44, 46, wherein the free ends 48, 50 of the limbs 44, 56 are angled away therefrom. Provided on the outer contour of the body 42 is a fastening block 620 which holds two brush strips 640, 660 which are arranged at an angular spacing of 90°. This fastening clip 40E can be used as a component for sealing off cold and warm regions in a switchgear cabinet.

Figure 26:
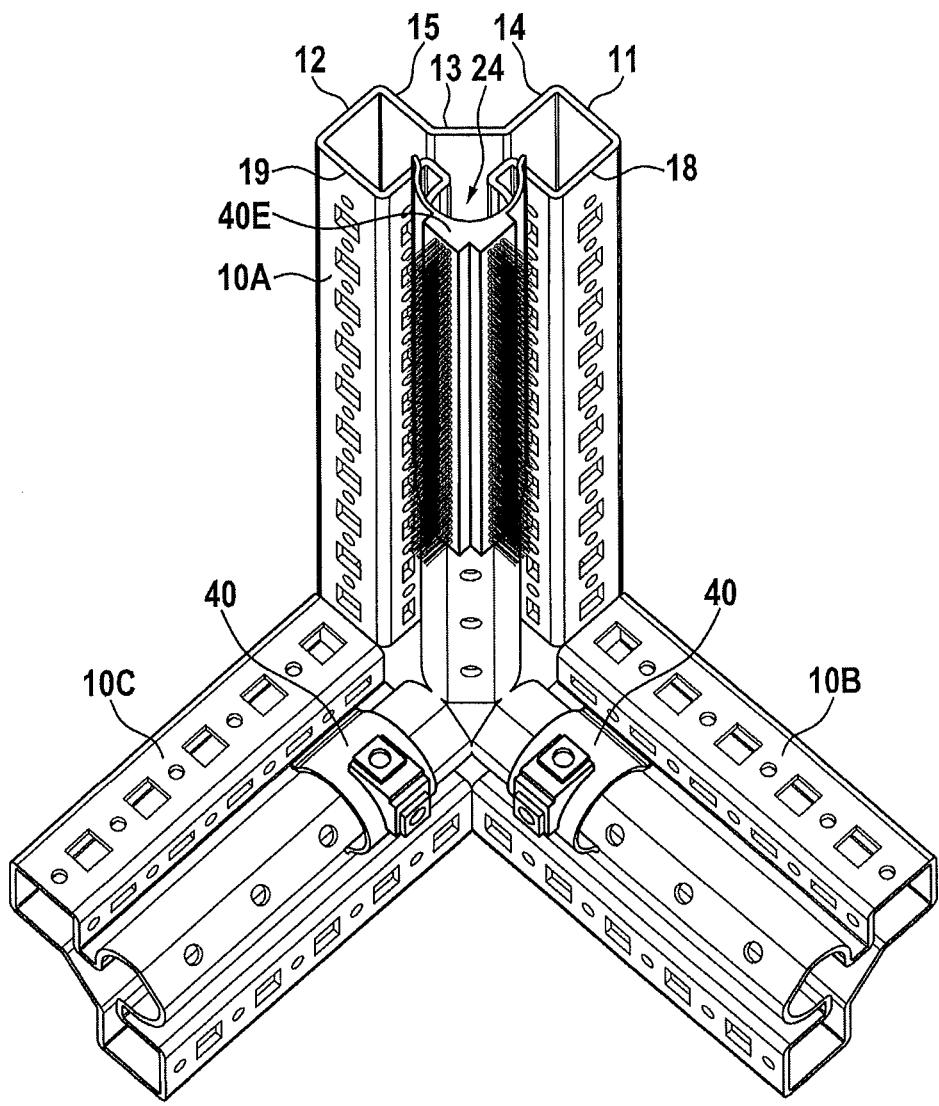
FIG. 26 shows the fastening clip from FIG. 25 on a vertical frame profile according to the present invention.
Figure 27:
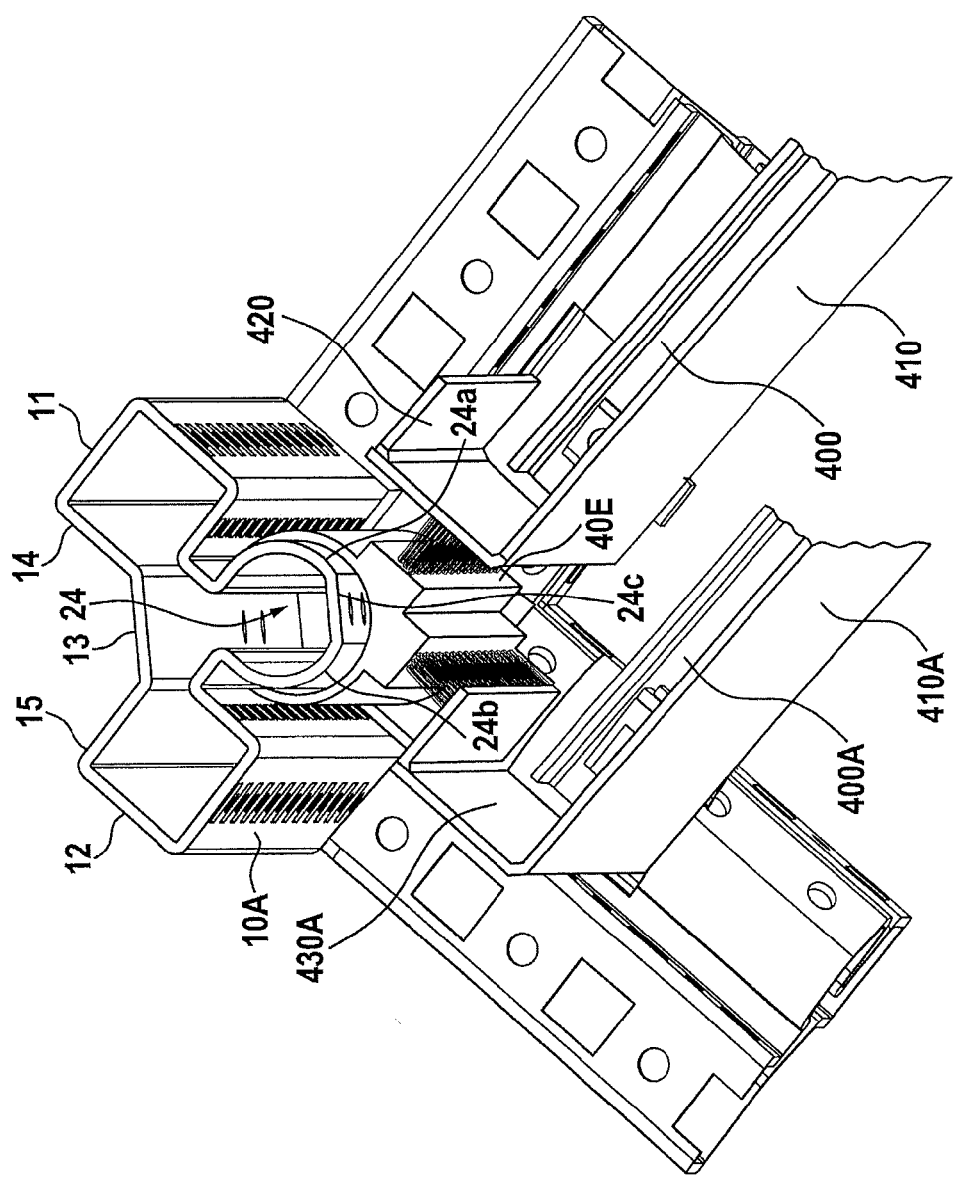
FIG. 27 shows the mounting of air baffle plates for the air-conditioning of a switchgear cabinet.

To this end, the fastening clip 40E is placed on the contour section 24 of a vertical frame profile 10A, as is illustrated in FIG. 26. Fastening clips 40 according to FIG. 4 are plugged onto horizontal frame profiles 10C, 10B. Air baffle plates 400, 400A are attached to said fastening clips, as can be seen in FIG. 27, such that guide walls 410, 410A extend parallel to one another. In this case, the air baffle plates 400, 400A are configured such that bearing surfaces 420, 430A come to rest against the brush strips 640, 660 of the fastening clip 40E such that cold and warm regions are sealed off.

The features of the invention that are disclosed in the above description, in the claims and in the drawing may be essential both individually and in any combination in order to execute the invention.

LIST OF REFERENCE SIGNS

No. Designation
10, 10′ Frame profile
10″ Frame profile
10*a* Frame profile
10*b* Frame profile
10*c* Frame profile
11, 11′ Profile side
11*a* Offset region
11*b* Offset region
12, 12′ Profile side
12*a* Offset region
12*b* Offset region
13 Connecting web
14, 14′ Transition section
15, 15′ Transition section
18 Profile section
19 Profile section
20 Profile section
21 Profile section
22, 22′ Profile section
22″ Profile section
23, 23′ Profile section
23″ Profile section
24 Rounded contour section
24*a* Rounded contour section
24*b* Rounded contour section
24*c* Flattened region
40, 40A Fastening clips
40B, 40C Fastening clips
40D, 40E Fastening clips
42 Body of 40
44 Spring-elastic limb
46 Spring-elastic limb
48 Free ends
48A Retaining tab
50 Free ends
50A Retaining tab
52, 52A Connection block
52B, 52C Connection block
53B, 53C Opening
54, 54A Receptacle
54B Receptacle
54C Guide groove
55B Latching arm
55C Latching tongue
56 Receptacle
56B Receptacle
56C Guide groove
57B, 57C Latching lug
58 Holder
58*a* Free end
58*b* Free end 60 Holder
60a Free end
60b Free end
62 Holder
70 Cable
80 Switchgear cabinet light
82 Flange
84 Flange
90 Multiple socket outlet
92 Receiving housing
100 Mounting panel
102 Fold
110 Adapter
112 Body
114 Latching peg
120 Adapter
122 Body
124 Opening
126 Free end
128 Free end
130 Opening
200 T-pipe
300 Distributor pipe
310 Distributor pipe section
320 Pipe extension
620 Fastening block
640 Brush strip
660 Brush strip
400 Air baffle plate
400A Air baffle plate
410 Guide walls
410A Guide walls
420 Bearing surface
430 Bearing surface
181 Square openings
182 Circular opening
183 Square openings
184 Circular opening
191 Square openings
192 Circular opening
193 Square openings
194 Circular opening
220 Apertures
230 Apertures
240 Circular opening
242 Slot
244 Slot
H Hollow chamber
T1 Part chamber
T2 Part chamber
D Cross section diagonal, plane of symmetry

What is claimed:

1. A frame profile for a rack of a switchgear cabinet, said frame profile comprising two profile sides that are perpendicular to one another and configured to form outer sides of the rack, and being in the form of a hollow-profile section, wherein:
the profile sides transition into one another via two transition sections, each transition section being perpendicular to the one of the two profile sides to which it is adjoined, and a connecting web connecting the two transition section and configured so as not to form an outer side of the rack;
the profile sides are adjoined, facing away from the transition sections by four first profile sections; wherein two of said four first profile section are respectively perpendicular to the profile sides and, wherein the other two of said four first profile section are parallel to the profile sides; and
at least the perpendicular first profile sections or the parallel first profile sections are provided with a row of fastening receptacles;
further wherein the perpendicular first profile sections are adjoined by two second profile sections which transition into an at least partially rounded contour section, wherein the second profile sections each form with the contour section an undercut of the contour section on the outer side of the profile, and in that the frame profile encloses a coherent hollow chamber.

2. The frame profile according to claim 1, wherein the parallel first profile sections are shorter than the associated profile sides in a cross-sectional view of the frame profile such that the frame profile is not closed but defines a single hollow chamber.

3. The frame profile according to claim 1, wherein the contour section has two mutually opposite rounded regions which are connected by a flattened region which extends parallel to and spaced apart from the connecting web.

4. The frame profile according to claim 1, wherein the connecting web is at an angle of 135° to the two profile sides.

5. The frame profile according to claim 1, wherein the hollow chamber has two mutually opposite part chambers having a substantially rectangular cross section.

6. The frame profile according to claim 1, wherein the second profile sections perpendicularly adjoin the perpendicular first profile sections.

7. The frame profile according to claim 1, wherein the second profile sections adjoin the perpendicular first profile sections with a curve.

8. The frame profile according to claim 1, wherein the second profile sections have openings.

9. The frame profile according to claim 8, wherein the openings continue into the contour section.

10. The frame profile according to claim 1, wherein the profile sides are provided with a step that drops in the direction of the connecting web.

11. The frame profile according to claim 1, wherein it is formed in a symmetrical manner with respect to the cross section diagonal.

12. The frame profile according to claim 1, wherein the contour section is provided with a row of holes.

13. The frame profile according to claim 12, wherein the row of holes comprises openings that are at least partially at an identical vertical spacing.

14. The frame profile according to claim 12, wherein the row of holes comprises horizontally extending slots and/or circular openings.

15. The frame profile according to claim 3, wherein the flattened region of the contour section is provided with a row of holes.

16. The frame profile according to claim 3, wherein the flattened region of the contour section is provided with a row of holes made up of circular openings that are at an identical vertical spacing.

17. The frame profile according to claim 1, wherein the perpendicular first profile sections and the parallel first profile sections are each provided with a row of holes.

18. The frame profile according to claim 1, wherein the rounded regions of the contour section are partial circles, partial ellipses or partial ovals.

19. A rack of a switchgear cabinet, in which at least the vertically extending frame profiles are those according to claim 1.

20. A rack of a switchgear cabinet, in which at least the vertically extending frame profiles and at least two horizontally extending frame profiles of the bottom region and/or of the top region are those according to claim 1.

21. A fastening clip for detachably attaching to a frame profile according to claim 1, having a mirror-symmetrical body with a U-shaped cross section which has spring-elastic limbs, wherein the inner contour of the body is selected so as to correspond at least sectionally to the outer contour of the contour section of the frame profile such that the body fits with a friction fit on the contour section, wherein the free ends of the limbs project into the undercut between the two profile sections and the contour section.

22. The fastening clip according to claim 21, wherein the limbs are dimensioned such that when the fastening clip is fitted on the contour section, with the planes of symmetry of the frame profile and the fastening clip corresponding to one another, a spacing remains between the free ends of the limbs and the second profile sections.

23. The fastening clip according to claim 21, wherein the inner contour of the body has a regular curve, wherein the free ends of the limbs are angled.

24. The fastening clip according to claim 21, wherein the inner contour of the body has a regular curve, wherein the limbs transition into retaining tabs.

25. The fastening clip according to claim 21, wherein a connection block is attached to the outer contour of the body, said connection block having at least one receptacle for a fastening element.

26. The fastening clip according to claim 25, wherein two receptacles at an angular spacing of 90° are provided on the connection block.

27. The fastening clip according to claim 21, wherein at least one holder having a substantially C-shaped cross section is arranged on the outer contour of the body.

28. The fastening clip according to claim 27, wherein a first free end of the holder is secured to the body, while a second free end of the holder remains at a spacing from the outer contour of the body.

29. The fastening clip according to claim 21, wherein a latching device for engaging in a fastening receptacle of the frame profile or in an opening in the contour section of the frame profile is arranged on the connection block.

30. The fastening clip according to claim 21, wherein a fastening block which holds at least one brush strip is attached to the outer contour of the body.

31. The fastening clip according to claim 30, wherein the at least one brush strip extends substantially along the axial length of the body.

32. The fastening clip according to claim 30, wherein two brush strips at an angular spacing of 90° are provided.

33. The fastening clip according to claim 21, wherein the body is produced from plastics material.

34. The fastening clip according to claim 21, wherein the body is produced from plastics material selected from the group consisting of polyamide, polyethylene, and polypropylene.

35. The fastening clip according to claim 21, wherein the body is produced from spring steel.

36. The frame profile according to claim 1, wherein the contour section comprises two opposed, convex rounded regions, and the second profile sections each form with a respective one of the rounded regions of the contour section and the undercut of the contour section on the outer side of the profile.

37. The frame profile according to claim 1, wherein the contour section is spaced apart from and extends away from the connecting web.

* * * * *